United States Patent
Mueller et al.

(10) Patent No.: US 7,792,505 B2
(45) Date of Patent: Sep. 7, 2010

(54) POWER AMPLIFIER EFFICIENCY USING ERROR ESTIMATE AND DATA RATE

(75) Inventors: Peter D Mueller, Fair Oaks, CA (US); Melanie Daniels, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 763 days.

(21) Appl. No.: 11/699,096

(22) Filed: Jan. 29, 2007

(65) Prior Publication Data
US 2008/0182530 A1 Jul. 31, 2008

(51) Int. Cl.
*H04B 1/04* (2006.01)
*H04K 3/00* (2006.01)
(52) U.S. Cl. .................. 455/126; 455/127.1
(58) Field of Classification Search .......... 455/126, 455/127.1–127.3; 370/208, 319, 344; 375/296, 375/297
See application file for complete search history.

(56) References Cited

U.S. PATENT DOCUMENTS

| | | | |
|---|---|---|---|
| 6,535,066 B1 * | 3/2003 | Petsko | 330/285 |
| 2003/0114127 A1 * | 6/2003 | Baldwin | 455/245.1 |

* cited by examiner

*Primary Examiner*—Lee Nguyen
(74) *Attorney, Agent, or Firm*—Kacvinsky Daisak, PLLC

(57) ABSTRACT

A method of adjusting a power amplifier may include producing a power measure of an output signal of the power amplifier and estimating an estimated transmission error of the output signal from the power measure. The estimated transmission error may be compared with a maximum error that is associated with a data rate of the output signal. A bias voltage that is input to the power amplifier may be decreased if the comparing determines that the estimated transmission error is less than the maximum error.

17 Claims, 4 Drawing Sheets

| IEEE 802.16 Transmit RCE Requirements | |
|---|---|
| Data rate (Mbps) | Relative Constellation Error (RCE) (dB) |
| 6 | -5 |
| 9 | -8 |
| 12 | -10 |
| 18 | -13 |
| 24 | -16 |
| 36 | -19 |
| 48 | -22 |
| 54 | -25 |

POWER AMPLIFIER EFFICIENCY USING ERROR ESTIMATE AND DATA RATE

BACKGROUND

Implementations of the claimed invention generally may relate to radio frequency (RF) power amplifiers (PAs), and in particular to increasing the efficiency of such power amplifiers.

RF power amplifiers in wireless platforms may consume a significant amount of the power required for such platforms. Thus, efforts have been made to increase power amplifier efficiency, for example, in mobile (e.g., battery powered) wireless platforms and/or systems.

Some schemes to increase PA efficiency have focused on reducing the peak to average power ratio (PAPR) of PAs in the digital domain using various modulation and coding techniques. Other schemes to increase PA efficiency have focused on improving the efficiency of the power amplifier by various RF techniques such as envelope tracking.

Such schemes to increase PA efficiency, however, may be computationally intensive and/or may result in unacceptable power usage by the PA in certain usage scenarios.

BRIEF DESCRIPTION OF THE DRAWINGS

The accompanying drawings, which are incorporated in and constitute a part of this specification, illustrate one or more implementations consistent with the principles of the invention and, together with the description, explain such implementations. The drawings are not necessarily to scale, the emphasis instead being placed upon illustrating the principles of the invention. In the drawings.

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of the claimed invention. However, it will be apparent to those skilled in the art having the benefit of the present disclosure that the various aspects of the invention claimed may be practiced in other examples that depart from these specific details. In certain instances, descriptions of well known devices, circuits, and methods are omitted so as not to obscure the description of the present invention with unnecessary detail.

Figure 1:
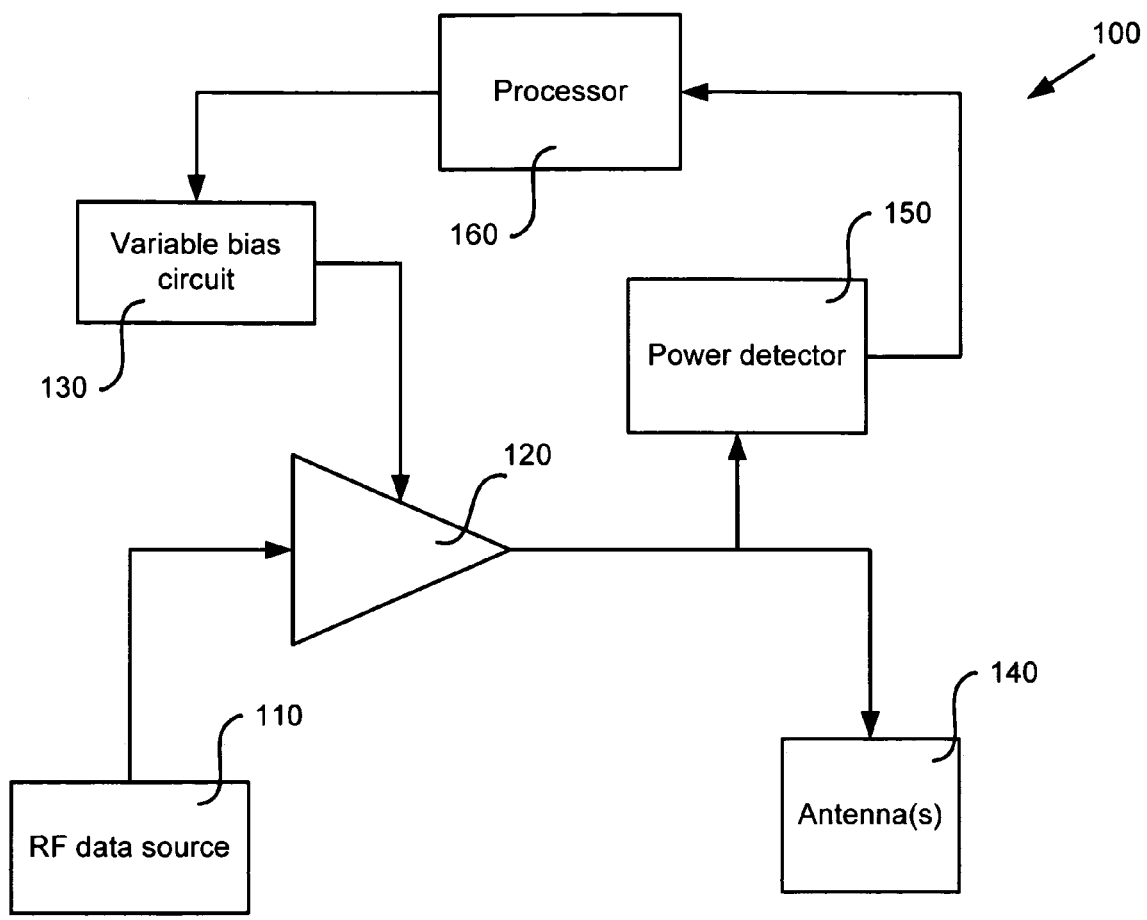
FIG. 1 illustrates a portion of a wireless transmission system including a power amplifier.

FIG. 1 illustrates a portion of a wireless transmission system 100. Other functional portions of system 100 may be present, but are not shown in FIG. 1 for ease of illustration. Further the elements of system 100 may be shown somewhat conceptually, but may include any specific implementations details and/or circuitry typically included with such items, whether specifically mentioned below or not. System 100 may include a source 110 of RF data, a power amplifier 120, a variable bias circuit 130, antenna(s) 140, a power detector 150, and a processor 160.

Source 110 may output data that has been formatted for transmission in accordance with one or more wireless standards. Such standards may include IEEE 802.11, IEEE 802.16, WCDMA, 3GPP, etc., but are not limited thereto. In some implementations, source 110 may output digital or pulse-type data modulated, for example, using binary phase shift keying (BPSK), quadrature phase shift keying (QPSK), 16-State quadrature amplitude modulation (16QAM), and/or 64-State quadrature amplitude modulation (64QAM). Other wireless standards and/or modulation schemes are both possible and contemplated. Source 110 may produce a modulated RF data stream that is suitable for amplification by power amplifier 120.

Power amplifier 120 may be arranged to amplify input RF data from source 110 and to output the amplified RF data to one or more antenna(s) 140. Power amplifier 120 may also be arranged to provide a variable linearity to its input signal based on a bias voltage from variable bias circuit 130. As the linearity applied to the input signal increases, however, so does the amount of electrical power consumed by power amplifier 120.

Variable bias circuit 130 may be arranged to provide a variable bias voltage to amplifier 120 based on a control signal from processor 160. In some implementations, variable bias circuit 130 may include, for example, a digital-to-analog converter (DAC) and voltage controlled source or similar circuitry to enable a digital control signal from processor 160. In any event, circuit 130 may be arranged to provide a variable signal (which may be referred to as a "bias" signal, a "linearity" signal, a control voltage, or by other names) to control an amount of linearity provided (and electrical power used) by power amplifier 120.

Antenna(s) 140 may include, one, two, three, or more antennas to wirelessly transmit the amplified output signal from power amplifier 120. The number and/or type of antennas 140 may vary, for example, based on the transmission standard(s) used by system 100. In some implementations, different, possibly switched, antennas 140 may be used in a system 100 that supports multiple wireless transmission standards. In any event, antenna(s) 140 may appear as an electrical load to amplifier 120 and may wirelessly transmit its output signals.

Power detector 150 may be arranged to detect and produce a measure of the RF power in the signal output by power amplifier 120. In some implementations, power detector 150 may measure the peak to average power ratio (PAPR) of the signal output by power amplifier 120, although another power measure may also or alternately be produced. In some implementations, power detector 150 may include, for example, an analog-to-digital converter (ADC) or similar circuitry to produce a digital PAPR signal to be input to processor 160.

Processor 160 may be arranged to provide a control signal to circuit 130 based, at least in part, upon the power measure (e.g., PAPR) from power detector 150. Processor 160 may also base its control signal on a data rate of the RF data from source 110, as will be explained in further detail below. In some implementations, processor 160 may be a main processor associated with system 100. In some implementations, however, processor 160 may be mainly associated with power amplifier 120. Further, in some implementations, processor 160 may include dedicated logic or circuitry to perform the control functionality described herein, rather than a general purpose processor executing software or firmware.

Figure 2:
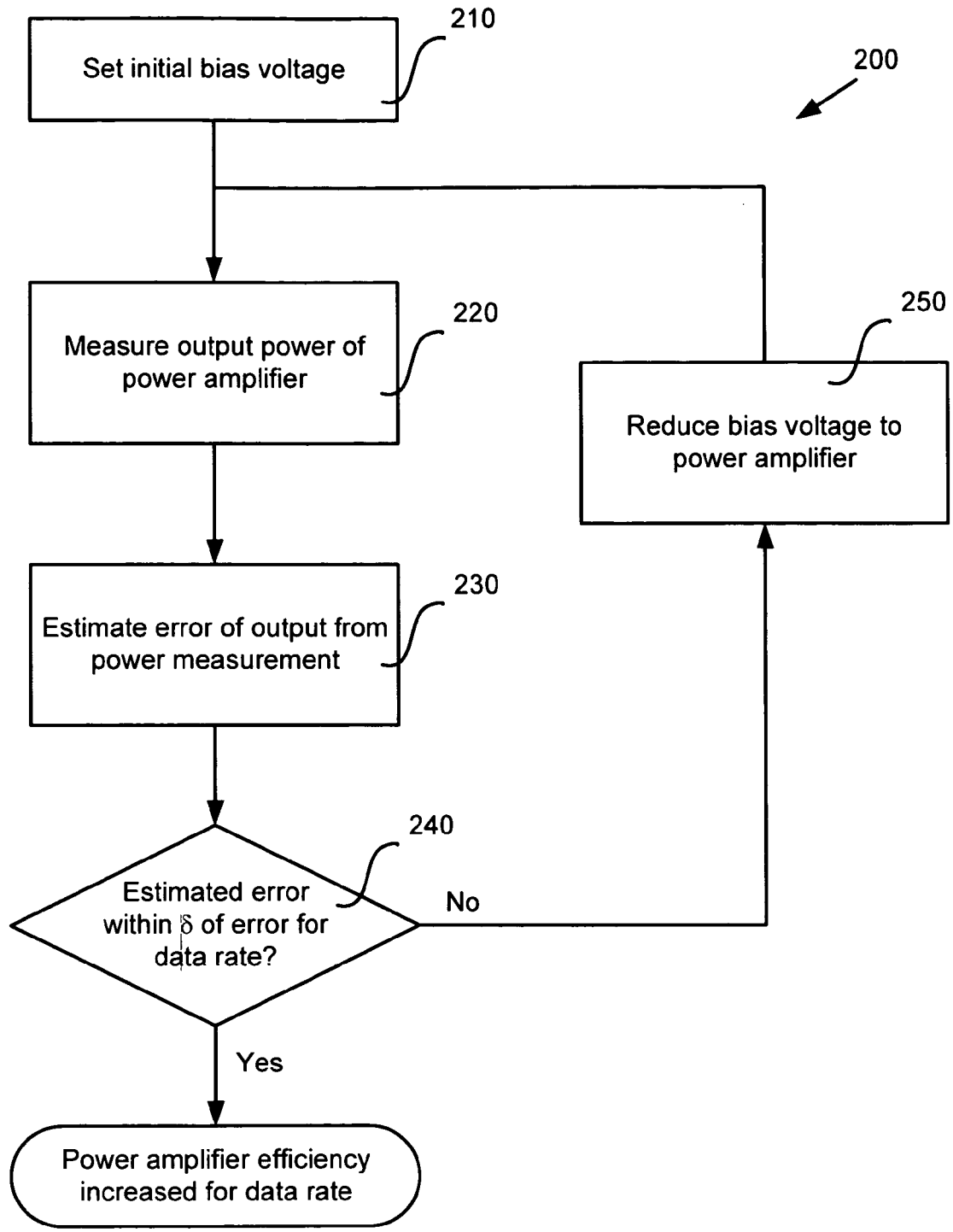
FIG. 2 illustrates a method of increasing the efficiency of a power amplifier.

FIG. 2 illustrates a method 200 of increasing the efficiency of a power amplifier 120. Although described with respect to FIGS. 1 and 3-5 for ease of explanation, the scheme described in FIG. 2 should not be construed as limited to the particulars of these other figures. Method 200 may begin with processor 160 controlling variable bias circuit 130 to set an initial bias voltage for power amplifier 120 [act 210]. In act 210, processor 160 may set the bias voltage to amplifier 120 relatively high to ensure a relatively low transmission error. As will be explained further below, this relatively high bias voltage might be decreased by later acts in method 200. In some implementations, processor 160 may set the initial bias voltage based on the data rate of source 110, setting a higher voltage for a greater data rate.

Method 200 may continue with power detector 150 measuring the output power of power amplifier 120 [act 220]. In some implementations, act 210 may include determining the PAPR of the signal output from amplifier 120. It should be noted, however, that other measures of the output power of amplifier 120 than the PAPR, such as alternate channel power ratio (ACPR), may be determined in act 220.

Figures 3, 4:
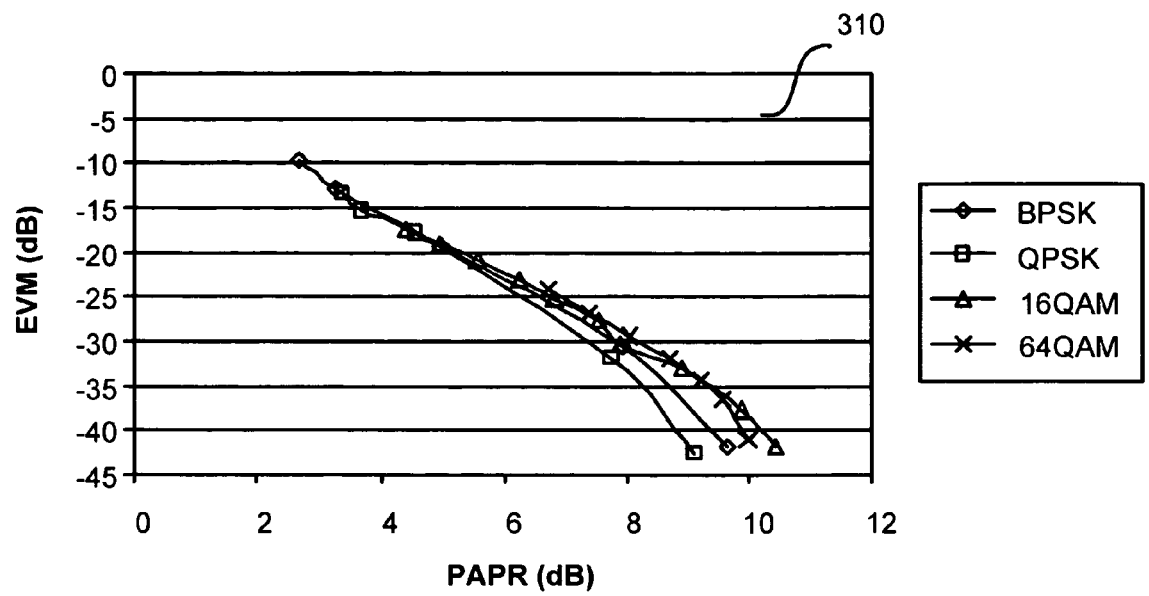
FIG. 3 illustrates a plot of transmission error versus peak to average power ratio (PAPR) for a power amplifier.
FIG. 4 shows a table comparing transmission error and data rate.

Method 200 may continue with processor 160 estimating a transmission error of the output of power amplifier 120 from the power measure (e.g., the PAPR) [act 230]. The inventors have discovered that there is a direct correlation between the PAPR and an error measure associated with the output. FIG. 3 illustrates a plot 310 of transmission error versus peak to average power ratio (PAPR) for a power amplifier. As may be seen from plot 310, on a decibel scale, the error vector magnitude (EVM) (which is one type of transmission error) varies roughly linearly with the PAPR. Although not shown in FIG. 3, another error measure that is also directly correlated with PAPR is the receive constellation error (RCE) as specified in the IEEE 802.16 wireless standard.

Accordingly, in act 230 processor 160 may estimate the transmission error (e.g., EVM and/or RCE) using, for example, a proportionality constant or scale factor to multiply the measured power value (e.g., PAPR) by. In some implementations, processor 160 in act 230 may estimate the transmission error using other estimation techniques, such as a lookup table of values, a linear/quadratic/spline function, etc. Act 230 may also estimate the transmission error differently according to the modulation scheme used. For example, different estimators may be used for each of the four curves (e.g., BPSK, QPSK, 16QAM, and 64QAM) shown in FIG. 3.

In certain wireless transmission standards (e.g., IEEE 802.11 and IEEE 802.16), acceptable levels of transmission error are specified for different transmission data rates. FIG. 4 shows an exemplary table 410 comparing transmission error and data rate for IEEE 802.16. As may be seen in table 410, for a relatively low data rate (e.g., 6) a relatively high transmission error (i.e., RCE of −5 dB) is acceptable. Of course, lower RCEs than those listed in table 410 are also acceptable. Conversely, for a relatively high transmission data rate (e.g., 54) a relatively low transmission error (i.e., RCE of −25 dB) is needed. As illustrated in FIG. 4, there is a data rate-dependent "maximum allowable error" value (e.g., that may be expressed as an EVM, an RCE, or some other error measure, depending on the transmission standard used).

Returning to FIG. 2, method 200 may continue with processor 160 determining whether the estimated error from act 230 is within a range δ of the maximum allowable error for the data rate at which source 110 is outputting data [act 240]. In act 240, processor 160 may be aware of the data rate of source 110 from its other data processing and/or supervisory functions. In some implementations, however, processor 160 may measure or otherwise acquire the data rate from source 110.

Using the data rate, in act 240 processor 160 may determine the maximum allowable error from, for example, a lookup table similar to table 410. The range δ may be conceptualized as a "close enough point" or a buffer zone from the maximum allowable error for the data rate to permit the error of power amplifier to be raised without exceeding the maximum allowable error. In some implementations, such a range δ may be around 0.5 dB to around 3 dB from the maximum allowable error, but other ranges δ may be employed.

If, for example, the estimated error of amplifier 120 is within the range δ of the maximum allowable error for the data rate in act 240, method 200 may conclude by judging the efficiency of power amplifier 120 to be sufficient. If not, processor 160 may control circuitry 130 to reduce the bias voltage to power amplifier 120 [act 250]. Reducing the bias voltage to power amplifier 120 acts to also reduce the PAPR of amplifier 120. This reduction of PAPR, in turn, degrades (i.e., increases) the resultant EVM, but improves the efficiency of power amplifier 120 because the device is operating more in saturation. After reducing the bias voltage in act 250, acts 220-240 may be repeated for the new bias voltage, as may act 250 depending on the result of act 240. In this manner, the amplifier 120 may be made more efficient (by using lower electrical power) without exceeding the maximum allowable error for a given data rate. This may be conceptually understood with reference to FIG. 5.

Figure 5:
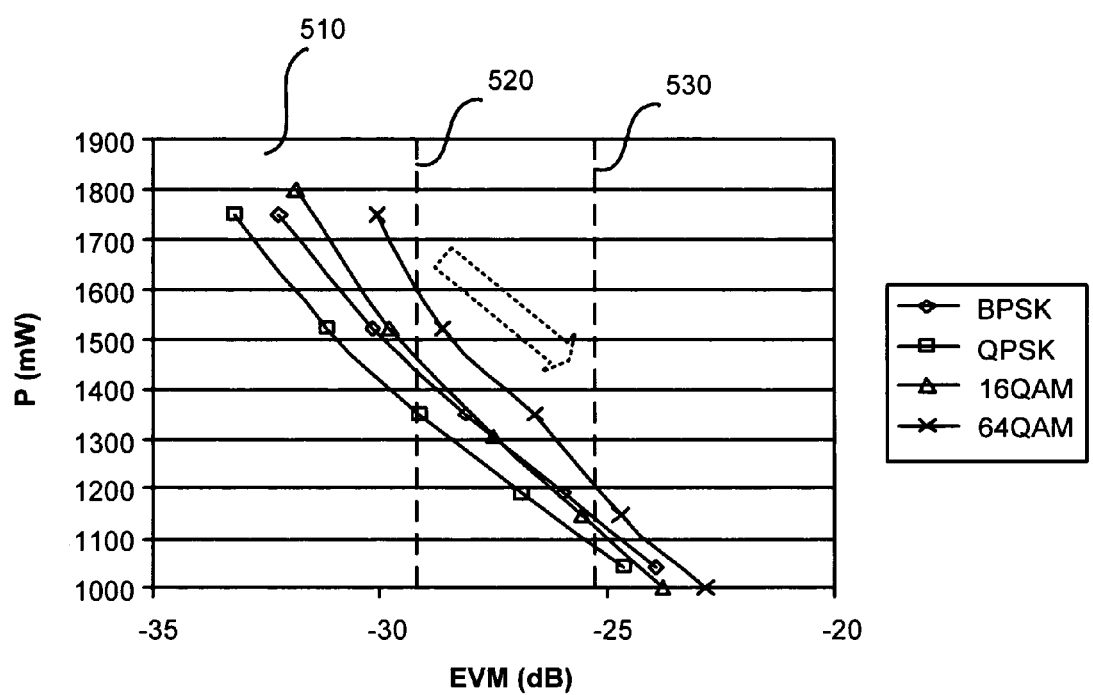
FIG. 5 illustrates a plot of electrical power versus transmission error for a power amplifier.

FIG. 5 illustrates a plot 510 of electrical power (e.g., determined by the bias voltage) versus transmission error for power amplifier 120 using different modulation schemes. As may be seen in FIG. 5, as the electrical power (e.g., determined by the bias voltage) of amplifier 120 is decreased, the transmission error (e.g., EVM) increases (becomes less negative on a dB scale). For example, with reference to method 200 and the right-most curve (64 QAM denoted by X data points) in FIG. 5, the initial bias voltage set in act 210 may result in an electrical power of about 1600 mW used by amplifier 120 and an estimated error (e.g., EVM) in act 230 of about −29 dB, both values being shown by dashed line 520. Assuming that this estimated error is lower, in act 240, than the maximum allowable error for the particular transmission data rate, acts 250, 220, 230, and 240 may be repeated one or more times to lower the electrical power and correspondingly raise the transmission error. This may move the error of amplifier 120 down the curve in the direction of the dashed arrow in FIG. 5. When act 240 determines that the estimated error in act 230 is close enough to the maximum allowable error in act 240, for example, an electrical power of about 1200 mW may be used by amplifier 120 and the estimated error (e.g., EVM) in act 230 may be about −25.5 dB, both values being shown by dashed line 530. In this manner, a lowering of the bias voltage to power amplifier 120 based on measured power (e.g., PAPR), estimated error (e.g., EVM or RCE), and a maximum error associated with the data rate may result in lowered electrical power consumption by amplifier 120, while maintaining acceptable transmission performance.

Although method 200 has been described as an iterative one, some implementations may, with good knowledge of an electrical power verses transmission characteristic for an amplifier 120, adjust the bias voltage in a single step to achieve a sufficiently degraded (e.g., increased) transmission error. Further, other schemes than method 200 are possible and contemplated that estimate a transmission error measure (e.g., EVM or RCE) from a power measure (e.g., PAPR) of a power amplifier. Also, other schemes than method 200 are possible and contemplated that adjust the bias of a power amplifier based on both a power measure (e.g., PAPR) and a transmission data rate.

The above-described scheme and apparatus may advantageously take advantage of the fact that different data rates have different EVM requirements. As a result, the power efficiency (e.g., also known as the power added efficiency (PAE)) of the amplifier can be optimized for each transmission and/or change in data rate. The scheme and apparatus also provide a straightforward way to estimate EVM using the PAPR for the transmitter. As is apparent from the above example using FIG. 5, a significant amount of electrical power may be saved by degrading the EVM within the limits of the transmission standard. Such a scheme may be used to extend the battery life of the system, as the RF power amplifier is typically one of the most significant sources of power drain.

The foregoing description of one or more implementations provides illustration and description, but is not intended to be exhaustive or to limit the scope of the invention to the precise form disclosed. Modifications and variations are possible in light of the above teachings or may be acquired from practice of various implementations of the invention.

For example, although the above-described scheme reduces the bias voltage to degrade an error measure (e.g., EVM), the scheme may also periodically or occasionally check to determine that the estimated error measure has not exceeded the maximum allowable error. If such a check (e.g., after operation for a time at a certain data rate) determines that the maximum allowable error for that data rate has been exceeded, the bias voltage to amplifier 120 may be increased to enhance the estimated error measure. Such increase in bias voltage may decrease the power efficiency of amplifier, but it may ensure that the transmitted signal remains within the parameters of the particular communication standard. Other operational details such as this will be apparent to those skilled in the art.

No element, act, or instruction used in the description of the present application should be construed as critical or essential to the invention unless explicitly described as such. Also, as used herein, the article "a" is intended to include one or more items. Variations and modifications may be made to the above-described implementation(s) of the claimed invention without departing substantially from the spirit and principles of the invention. All such modifications and variations are intended to be included herein within the scope of this disclosure and protected by the following claims.

What is claimed:

1. An apparatus for wirelessly transmitting data, comprising:
    a source of data to produce an input signal having an associated data rate;
    a variable bias circuit to generate a bias voltage;
    a power amplifier connected to the source and the variable bias circuit to amplify the input signal based on the bias voltage to produce an output signal;
    a power detector to generate a power measure of the output signal; and
    a processor connected to the power detector and the variable bias circuit to selectively control the variable bias circuit to lower the bias voltage based on the power measure and the data rate of the input signal, wherein the processor is arranged to estimate a transmission error measure from the power measure and wherein the processor is further arranged to compare the transmission error measure with a maximum allowable error that is associated with the data rate of the input signal, and to control the variable bias circuit to lower the bias voltage if the transmission error measure is lower than the maximum allowable error.

2. The apparatus of claim 1, further comprising:
    an antenna connected to the power amplifier to transmit the output signal.

3. The apparatus of claim 1, wherein the transmission error measure is a relative constellation error or an error vector magnitude, and
    wherein the power measure is a peak to average power ratio.

4. The apparatus of claim 1, wherein the processor is arranged to estimate a transmission error measure by performing an arithmetic operation on the power measure.

5. A method of adjusting a power amplifier, comprising:
    producing a power measure of an output signal of the power amplifier;
    estimating an estimated transmission error of the output signal from the power measure;
    comparing the estimated transmission error with a maximum error that is associated with a data rate of the output signal; and
    decreasing a bias voltage input to the power amplifier if the comparing determines that the estimated transmission error is less than the maximum error.

6. The method of claim 5, further comprising:
    inputting an initial bias voltage to the power amplifier before the producing.

7. The method of claim 5, further comprising:
    repeating the producing a power measure, the estimating an estimated transmission error, and the comparing the estimated transmission error after decreasing the bias voltage.

8. The method of claim 5, further comprising:
    transmitting the output signal from an antenna.

9. The method of claim 5, wherein the estimated transmission error is a relative constellation error or an error vector magnitude, and
    wherein the power measure is a peak to average power ratio.

10. The method of claim 5, wherein the estimating includes:
    multiplying the power measure by a scaling factor or looking up the estimated transmission error in a table using the power measure.

11. The method of claim 5, wherein the comparing includes:
    determining whether the estimated transmission error is less than and not within a predetermined range of the maximum error.

12. A method of increasing efficiency of a power amplifier, comprising:
    measuring a peak to average power ratio of an output signal of the power amplifier;
    determining a data rate of the output signal;
    calculating an estimated error based on the peak to average power ratio; and
    adjusting a linearity of the power amplifier based on both the peak to average power ratio and the data rate.

13. The method of claim 12, further comprising:
    obtaining a maximum allowable error based on the data rate.

14. The method of claim 12, wherein the estimated error includes a relative constellation error or an error vector magnitude.

15. The method of claim 12, wherein the adjusting includes:

decreasing the linearity of the power amplifier when the estimated error is substantially less than the maximum allowable error.

16. The method of claim 15, wherein the decreasing includes:

lowering a control voltage input to the power amplifier.

17. The method of claim 12, wherein the calculating includes:

scaling the peak to average power ratio by a constant, or applying an arithmetic function to the peak to average power ratio.

* * * * *